(12) United States Patent
Wolthuis

(10) Patent No.: US 6,737,992 B1
(45) Date of Patent: May 18, 2004

(54) METHOD, APPARATUS, AND ARTICLE FOR GIOP MESSAGE COMPRESSION/DECOMPRESSION

(75) Inventor: Johannes M. Wolthuis, Den Haag (NL)

(73) Assignee: PrismTech Limited (GB)

( * ) Notice: Subject to any disclaimer, the term of this patent is extended or adjusted under 35 U.S.C. 154(b) by 759 days.

(21) Appl. No.: 09/663,766

(22) Filed: Sep. 18, 2000

Related U.S. Application Data

(60) Provisional application No. 60/192,690, filed on Mar. 28, 2000.

(51) Int. Cl.[7] .................................................. H03M 5/00
(52) U.S. Cl. .......................................... 341/55; 341/50
(58) Field of Search ....................... 341/55, 50; 709/247

(56) References Cited

U.S. PATENT DOCUMENTS 5,357,546 A * 10/1994 Meriwether et al. ........ 375/240
6,092,130 A * 7/2000 Horiike ........................ 710/69
6,369,723 B1 * 4/2002 Pieterse et al. ................ 341/55

* cited by examiner

*Primary Examiner*—Peguy JeanPierre
(74) *Attorney, Agent, or Firm*—Perkins Coie LLP

(57) ABSTRACT

In one aspect, replacing padding characters from a body of a GIOP message with paddding character replacement control sequences compresses the message before transmission. In another aspect of the invention, replacing paddding character replacement control sequences with padding characters in the body of a compressed GIOP message decompresses the message upon receipt. In a further aspect, replacing repetitive strings of characters in the body of a GIOP message with repetitive replacement control sequences compresses the GIOP message before transmitting. In yet a further aspect, replacing repetitive replacement control sequences with repetitive sequences of values in the body of GIOP message for control sequences upon receipt of the message decompresses the message.

48 Claims, 13 Drawing Sheets

First control byte (byte 0)

| First control byte, bit format | 0 | 1 | 2 | 3 | 4 | 5 | 6 | 7 |
|---|---|---|---|---|---|---|---|---|
| Index of first sequential control byte: 0..127 | 0 | X | X | X | X | X | X | X |

Sequential control byte

| Sequential control byte, bit format | 0 | 1 | 2 | 3 | 4 | 5 | 6 | 7 |
|---|---|---|---|---|---|---|---|---|
| LLLIIIII (L=len, I=index) | L | L | L | I | I | I | I | I |
| L=Length of padding: 0..7 | | | | | | | | |
| I=Index of next sequential control byte: 0..31 | | | | | | | | |
| If I=0, end of compression sequence reached. | | | | | | | | |

Example GIOP message format /52

|  | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0: | 1 | 0 | 0 | 0 | 5 | 0 | 0 | 0 | 10 | 0 | 0 | 0 | 6 | 0 | 0 | 0 |
| 16: | 113 | 117 | 111 | 116 | 101 | 0 | 205 | 205 | 0 | 0 | 0 | 0 | 1 | 205 | 205 | 205 |
| 32: | 20 | 0 | 0 | 0 | 73 | 73 | 79 | 80 | 95 | 80 | 79 | 65 | 47 | 81 | 117 | 111 |
| 48: | 116 | 101 | 83 | 101 | 114 | 118 | 101 | 114 | 9 | 0 | 0 | 0 | 103 | 101 | 116 | 81 |
| 64: | 117 | 111 | 116 | 101 | 0 | 205 | 205 | 205 | 0 | 0 | 0 | 0 | 4 | 0 | 0 | 0 |
| 80: | 73 | 66 | 77 | 0 |  |  |  |  |  |  |  |  |  |  |  |  |

FIG. 4

Example GIOP message compressed (padding removed, fcb and scb inserted)

|  | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0: | 2 x02 fcb | 1 | 98 x62 scb | 5 | 98 x62 scb | 10 | 98 x62 scb | 6 | 105 x69 scb | 113 | 117 | 111 | 116 | 101 | 0 | 205 |
| 16: | 205 | 134 x86 scb | 1 | 205 | 205 | 205 | 20 | 118 x76 scb | 73 | 73 | 79 | 80 | 95 | 80 | 79 | 65 |
| 32: | 47 | 81 | 117 | 111 | 116 | 101 | 83 | 101 | 114 | 118 | 101 | 114 | 9 | 109 x6d scb | 103 | 101 |
| 48: | 116 | 81 | 117 | 111 | 116 | 101 | 0 | 205 | 205 | 205 | 130 x82 scb | 4 | 96 x60 scb | 73 | 66 | 77 |
| 64: | 0 |  |  |  |  |  |  |  |  |  |  |  |  |  |  |  |

FIG. 5

First control byte (byte 0)

| First control byte, bit format | 0 | 1 | 2 | 3 | 4 | 5 | 6 | 7 |
|---|---|---|---|---|---|---|---|---|
| Index of first sequential control byte: 0..127 | 1 | X | X | X | X | X | X | X |

First sequential control byte (single byte)

| Sequential control byte, bit format | 0 | 1 | 2 | 3 | 4 | 5 | 6 | 7 |
|---|---|---|---|---|---|---|---|---|
| Contains length, and index to next string | 0 | L | L | L | I | I | I | I |
| L=Length of sequence: 0..7<br>I=Index of next sequential control byte: 0..16<br>If I=0, end of compression sequence reached. | | | | | | | | |

First sequential control bytes (two bytes)

| Sequential control byte, bit format | 0 | 1 | 2 | 3 | 4 | 5 | 6 | 7 |
|---|---|---|---|---|---|---|---|---|
| Length of sequence: 0..127 | 1 | L | L | L | L | L | L | L |
| Index of next repetition: 0..255 | I | I | I | I | I | I | I | I |
| L=Length of sequence: 0..127<br>I=Index of next sequential control byte: 0..255<br>If I=0, end of compression sequence reached. | | | | | | | | |

Next sequential control byte

| Sequential control byte, bit format | 0 | 1 | 2 | 3 | 4 | 5 | 6 | 7 |
|---|---|---|---|---|---|---|---|---|
| Index of next repetition: 0..255 | I | I | I | I | I | I | I | I |
| I=Index of next sequential control byte: 0..255<br>If I=0, end of compression sequence reached. | | | | | | | | |

FIG. 9

Example GIOP message before compression repetitive sequences

|     | 0   | 1   | 2   | 3   | 4   | 5   | 6   | 7   | 8   | 9   | A   | B   | C   | D   | E   | F   |
|-----|-----|-----|-----|-----|-----|-----|-----|-----|-----|-----|-----|-----|-----|-----|-----|-----|
| 0:  | 2   | 1   | 98  | 5   | 98  | 10  | 98  | 6   | 105 | 113 | 117 | 111 | 116 | 101 | 0   | 205 |
| 16: | 205 | 134 | 1   | 205 | 205 | 205 | 20  | 118 | 73  | 73  | 79  | 80  | 95  | 80  | 79  | 65  |
| 32: | 47  | 81  | 117 | 111 | 116 | 101 | 83  | 101 | 114 | 118 | 101 | 114 | 9   | 109 | 103 | 101 |
| 48: | 116 | 81  | 117 | 111 | 116 | 101 | 0   | 205 | 205 | 205 | 130 | 4   | 96  | 73  | 66  | 77  |
| 64: | 0   |     |     |     |     |     |     |     |     |     |     |     |     |     |     |     |

FIG. 10

Example GIOP message after compression repetitive sequences

|     | 0           | 1        | 2          | 3          | 4   | 5        | 6   | 7   | 8   | 9   | A   | B             | C             | D          | E          | F          |
|-----|-------------|----------|------------|------------|-----|----------|-----|-----|-----|-----|-----|---------------|---------------|------------|------------|------------|
| 0:  | 138 x8a fcb | 2        | 1          | 98         | 5   | 98       | 10  | 98  | 6   | 105 | 113 | 135 x87 scb   | 40 x28 scb    | 117 key    | 111 key    | 116 key    |
| 16: | 101 key     | 0 key    | 205 key    | 205 key    | 134 | 1        | 205 | 205 | 205 | 20  | 118 | 73            | 73            | 79         | 80         | 95         |
| 32: | 80          | 79       | 65         | 47         | 81  | 117      | 111 | 116 | 101 | 83  | 101 | 114           | 118           | 101        | 114        | 9          |
| 48: | 109         | 103      | 101        | 116        | 81  | 0 scb    | 205 | 130 | 4   | 96  | 73  | 66            | 77            | 0          |            |            |

FIG. 11

METHOD, APPARATUS, AND ARTICLE FOR GIOP MESSAGE COMPRESSION/DECOMPRESSION

CROSS-REFERENCE TO RELATED APPLICATIONS

This application claims the benefit of priority of U.S. Provisional Patent Application No. 60/192,690, filed on Mar. 28, 2000, the disclosure of which is incorporated herein by reference.

TECHNICAL FIELD

This invention is generally related to object oriented standardization and interoperatability among hardware and software products, and more particularly to implementation of an object request broker ("ORB") of the Common Object Request Broker Architecture ("CORBA").

BACKGROUND OF THE INVENTION

The Object Management Group ("OMG") developed CORBA to allow interoperability among the large variety of existing hardware and software products. CORBA includes an interface definition language ("IDL") and an application programming interface ("API") that enable client/server object interaction within a specific implementation of an object request broker ("ORB").

A CORBA implementation employs ORBs located on both the client and the server, to create and manage client-server communications between objects. ORB's are the key to the CORBA distributed object architecture. The ORB is a middle layer that establishes the client-server relationships between various objects. The ORB allows a client to transparently invoke a method on a server object that may be on the same machine, or on a different machine across a network. The ORB intercepts the client call and is responsible for locating an object that can implement the request, passing the appropriate parameters to the object invoking the objects method and returning the results. The ORBs allow objects on the client's side to make requests of objects on the server side, without any prior knowledge of where those objects exists, what language they are in, or what operating system they are running on. The client need not be aware of the location of the object, the object's programming language, the object's operating system or any other aspects of the system that are not part of the object's interface. Thus, the ORB provides interoperability between applications on different machines in heterogeneous distributed computing environments to interconnect multiple object systems.

Inter-ORB protocol ("IIOP") is the current standard CORBA 2.0 protocol for ORB-to-ORB interworking. IIOP has also recently been added as the transport protocol for Java remote invocation ("RMI"). Thus, CORBA enables invocations of methods on distributed objects residing anywhere on a network, just as if they were local objects. Additional material about CORBA is available through OMG's web site at www.omg.org, as well as other sites such as www.developer.com.

SUMMARY OF THE INVENTION

The CORBA generic inter-ORB protocol ("GIOP") is designed to work with high band width connections. The GIOP is not suited for the relatively low band width wireless connections that are becoming ever more popular. Compression can facilitate the transmission of GIOP packets over low bandwidth connections where the packets are later decompressed.

One aspect of the invention includes, replacing padding characters from a body of a GIOP message with paddding character replacement control sequences to compress the message before transmission. Another aspect of the invention includes, replacing paddding character replacement control sequences with padding characters in the body of a compressed GIOP message to decompress the message upon receipt.

A further aspect of the invention includes, replacing repetitive strings of characters in the body of a GIOP message with repetitive replacement control sequences to compress the GIOP message before transmitting. Yet a further aspect of the invention includes, replacing repetitive replacement control sequences with repetitive sequences of values in the body of GIOP message for control sequences upon receipt of the message to decompress the message.

Thus, the GIOP message may be optimized so as to carry it over a low bandwidth connection, such as a wireless connection. The hardware and software can operate with regular GIOP packets and compressed GIOP packets over any GIOP supported transport, including IIOP. Backwards compatibility with existing ORB implementations is insured, while new ORB implementations supporting compressed GIOP ("C-GIOP") can take full advantage of this concept.

BRIEF DESCRIPTION OF THE DRAWINGS

In the drawings, identical reference numbers identify similar elements or acts. The sizes and relative positions of elements in the drawings were not necessarily drawn to scale. For example, the shapes of various elements and angles are not drawn to scale, and some of these elements are arbitrarily enlarged and positioned to improve drawing legibility. Further, the particular shapes of elements, as drawn, are not intended to convey any information regarding the actual shape of the particular elements, and have been solely selected for ease of recognition in the drawings.

FIG. 2 is a schematic diagram of a data structure showing a sample format of a first padding control sequence.

FIG. 3 is a schematic diagram of a data structure showing a sample format of a sequential padding control sequence.

FIG. 4 is a schematic diagram of a data structure showing a body of a sample uncompressed GIOP message including padding values.

FIG. 5 is a schematic diagram of a data structure showing the sample contents of the GIOP message of FIG. 4, compressed by the removal of the padding values and the addition of padding control sequences.

FIG. 6 is a schematic diagram of a data structure showing a sample format of a first repetitive control sequence.

FIG. 7 is a schematic diagram showing a sample format of a first sequential repetitive control sequence of a first length.

FIG. 8 is a schematic diagram showing a sample format of a first sequential repetitive control sequence of a second length.

FIG. 9 is a schematic diagram of a sample format of a next sequential repetitive control sequence.

FIG. 10 is a schematic diagram of a data structure showing a body of a sample GIOP message before compression including repetitive sequences of sequential values.

FIG. 11 is a schematic diagram data structure showing the sample contents of a GIOP message of FIG. 5, compressed by the removal of the repetitive sequences and addition of the repetitive control sequences.

DETAILED DESCRIPTION

In the following description, certain specific details are set forth in order to provide a thorough understanding of various embodiments of the invention. However, one skilled in the art will understand that the invention may be practiced without these details. In other instances, well known structures associated with computers, computer networks, data structures and CORBA have not been shown or described in detail to avoid unnecessarily obscuring descriptions of the embodiments of the invention.

Unless the context requires otherwise, throughout the specification and claims which follow, the word "comprise" and variations thereof, such as, "comprises" and "comprising" are to be construed in an open, inclusive sense, that is as "including but not limited to." The headings provided herein are for convenience only and do not interpret the scope or meaning of the claimed invention".

Figure 1:
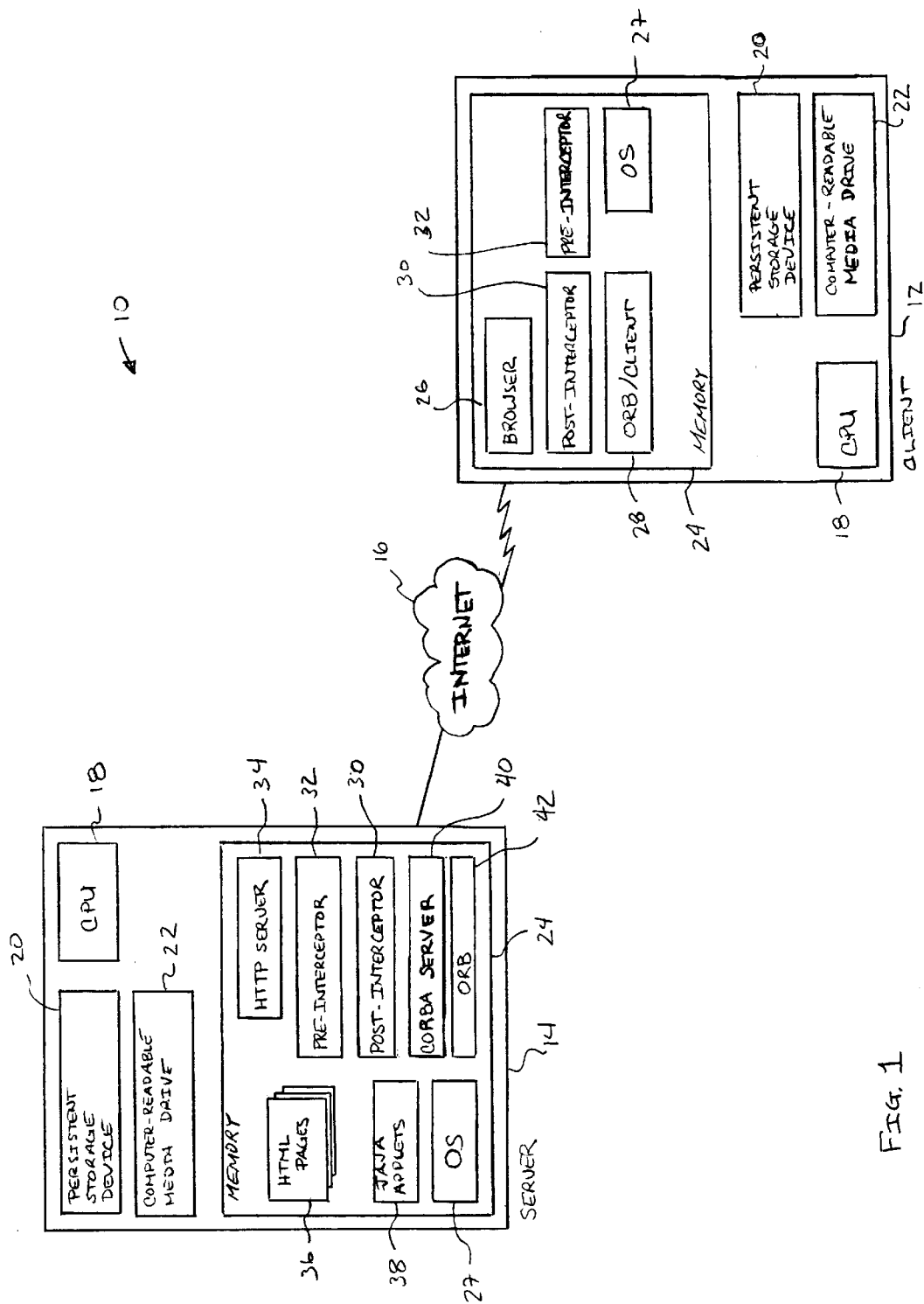
FIG. 1 is a high level block diagram showing an environment for transmitting and receiving GIOP messages including compressed GIOP messages.

FIG. 1 shows an environment 10 where a client computing device 12 communicates with a Server 14 over a network such as the Internet 16. The client computing device 12 can take any of a variety of forms including palm-top or hand-held computing appliances, laptop or desk top personal computers, workstations or other computing devices. The client computing device 12 includes a central processing unit ("CPU") 18, a persistent storage device 20, a computer readable media drive 22 and a memory 24.

The persistent storage device 20 may take the form of a hard drive or other memory device. The computer readable media drive 22 can take the form of floppy disk reader, a CD-ROM reader, DVD reader, an optical disk reader, or similar device that reads instructions from computer readable media.

The memory 24 can take the form of random access memory ("RAM") or other dynamic storage that temporarily stores instructions and data for execution by the CPU 18. For example, the memory 24 of the client computing device 12 contains instructions for communicating across the World Wide Web portion of the Internet 16 using standard protocol e.g., TCP/IP in the form of a web client or browser 26. A number of browsers are commercially available, such as NETSCAPE NAVIGATOR from AmericaOnLine, and INTERNET EXPLORER from Microsoft of Redmond, Wash. The memory 24 can include an operating system ("OS") 27 to provide instruction for running the client computing device 12. The memory 24 on the client computing device 12 also contains instructions to access objects on remote computing devices in the form of an ORB client 28. The memory 24 further contains instructions for identifying, compressing and decompressing GIOP messages in the form of a postinterceptor and a pre-interceptor 32.

The server 14 includes a CPU 18, persistent storage device 20, computer readable media drive 22 and memory 24 similar to the components of the client computing device 12. The memory 24 of the server 14 includes instructions for responding to the browser 26, in the form of an HTTP server 34 for transferring HTML pages 36 and Java Applets 38 to the client computing device 12 in response to a request from the browser 26. The memory 24 of the server 14 contains an OS 27 for controlling the operation of the server 14. The memory 24 of the server 14 also contains instructions for identifying, compressing and decompressing GIOP messages in the form of post-interceptor and pre-interceptor 32, similar to the instructions in the memory 24 of the client computing device 12. The memory 24 of the server 14 also includes instructions for responding to CORBA requests from the client computing device 12, in the form of a CORBA server 26 and an ORB 38.

The components of the client computing device 12 and server 14 and their operation are conventional except for the post-interceptor 30 and the pre-interceptor 32. The post-interceptor 30 and pre-interceptor 32 provide pre- and post-processing of GIOP messages. While not shown, the client computing device 12 can include an HTTP server similar to HTTP server 34, and the server 14 can include a browser similar to the browser 26.

FIG. 2 shows a sample format for a first padding replacement control sequence 44 for use in a padding based compression/decompression scheme that removes padding characters to compress a message and replaces the padding characters to decompress the message. The first padding replacement control sequence 44 is shown as a single byte of eight bits which is particularly suited for current CORBA GIOP protocols. While the exanples presented in the specification are typically discussed in terms of single bytes of 8 bits or double bytes of 16 bits, one skilled in the art will recognize that other sequence lengths can be suitable for this and other applications.

The first bit (0) of the first padding replacement control sequence 44 is set to zero or "low" and identifies the GIOP message as including padding based compression. The remaining seven bits (1–7) of the first padding replacement control sequence 44, store an index to a first sequential padding replacement sequence, the format of which is shown in FIG. 3. Where the first padding replacement control sequence 44 has a length of 8 bits, the index can have a value between 0 and 127.

FIG. 3 shows a format of the sequential padding replacement control sequences 46. Where the sequential padding replacement control sequence 46 is a single byte, the first three bits (0–2) identify a length of the padding sequence, and the second five bits (3–7) store an index to the next sequential padding replacement control sequence 46. The length of the padding sequence (i.e., the number of padding charaters or values) can be from 0 to 7, while the index of the next sequential padding replacement control sequence 46 can be between 0 and 31. An index value of 0 indicates that the end of the compression sequence has been reached and there are no further sequential padding replacement control sequences in the GIOP message.

FIG. 4 shows a sample GIOP message 48 before compression. Typically, a GIOP message will contain a twelve byte header, that is not shown in FIG. 4 for clarity of presentation. A top row 50 and an outside column 52 identify the position of the corresponding byte in the message. Thus, the uncompressed message 48 contains 84 bytes. A relatively large number of the bytes contain the value "0", that serves as a padding character of value for various message types. For example, bytes 1–3, 5–7, 9-B, and D–F in the first row (0) all contain the value "0."

FIG. 5 shows a compressed GIOP message 54, where a first padding replacement control sequence 44 and a number of sequential padding replacement control sequences 46 replace the padding values "0" in the uncompressed GIOP message 48. The first padding replacement control sequence 44 is located in the first byte (0) of the compressed message 54. The first padding replacement control sequence 44 has a binary coded decimal value equal to 2 and a hexadecimal value 02. The first padding replacement control sequence 44 is identified in the drawings by the letters "fcb" in the first byte (0) of the compressed GIOP message 54. The decimal value is noted in the top line of the cell representing the corresponding byte of the GIOP message 54, while the hexadecimal value is noted in the second line of the cell and proceeded by the letter "X". The decimal value 2, and the hexadecimal value 02 represent the bit string: "00000010". With reference to the format shown in FIG. 2, the first bit (0) identifies the first padding control sequence, while the remaining seven bits (1–7) identify the index to the next sequential padding replacement control sequence 46. The index ("0000010") in this case is equal to 2. Thus, the next sequential padding replacement control sequence 46 is two bytes from the first replacement padding control sequence 44, occurring at the third byte (2) of the compressed GIOP message 54.

The sequential padding replacement control sequence 46 has a decimal value of 98 and a hexadecimal value of 62, and is identified in the drawings by the letters "scb". The decimal value 98 and hexadecimal 62 represent the bit string: "0110010". With reference to the format shown in FIG. 3, the first three bits, "011" correspond to the length of the padding sequence, and the remaining five bits "00010" correspond to the index of the next sequential padding replacement control sequence 46. Thus, the padding sequence has length three (i.e., "011"=3), and the index to the next sequential padding replacement control sequence 46 is equal to two (i.e., "00010"=2). Reference to FIG. 4 confirms that the first padding sequence (bytes 1–3) has a length of three.

The reader can easily identify the remaining sequential padding replacement sequences from the letters "scb" in the cells identifying the bytes of the compressed GIOP message 54. A final sequential padding replacement control sequence 46 is shown at byte 61 (Row 48, Col. C) and has a decimal value of 96 and hexadecimal value of 60. The decimal value 96 and hexadecimal 60 represent the bit string "01100000". The first three bits "011" of the bit string identifies the length of the padding sequence as equal to three, and the final five bits "00000" identify the index as being equal to zero, signifying that there are no further sequential padding replacement control sequences in the compressed GIOP message 54.

FIG. 6 shows a sample format for first repetitive replacement control sequence 56 for use in a repetitive sequence based compression/decompression scheme. The repetitive sequence based compression/decompression scheme removes repetitive sequences of sequential values occurring in the GIOP message to compress the message and replaces the repetitive sequences to decompress the GIOP message.

The first repetitive replacement control sequence 56 is shown having a length of one byte (i.e., 8 bits), which is particularly suited for GIOP messages, although other lengths are possible. The first bit (0) is set to one or "high" to identify that the GIOP message includes repetitive sequence based compression. The remaining seven bits (1–7) represent an index of a first sequential repetitive replacement control sequence 58, the format of which is shown in FIGS. 7 and 8.

FIG. 7 shows the first sequential repetitive replacement control sequence 58 in the form of a single byte value having eight bits. The first byte (0) is equal to zero or "low" to indicate that the first sequential repetitive replacement control sequence 58 is has a length of one byte (i.e., 8 bits). The next three bits (1–3), indicate the length of the string or repetitive sequence of sequential values being replaced. The remaining four bytes 4–7 indicate the index of a next sequential repetitive replacement control sequence 60 the format of which is shown in FIG. 9.

FIG. 8 shows the first sequential repetitive control sequence 58 having a length of two bytes (i.e., 16 bits). The two byte length allows the storage of a longer repetitive sequence length and/or a longer index value in the first sequential repetitive replacement control sequence 58. The first bit (0) is set equal to one or "high" to indicate that the first sequential repetitive replacement control sequence 58 has a two byte length. The following seven bits (1–7) indicate the length of the repetitive sequence of sequential values being replaced in the message. The seven bits can store values from 0 to 127. The remaining eight bits (8–15) indicate the index of the next sequential repetitive replacement control sequence 60, and can store values between 0 and 255. An index value of zero indicates that there are no further sequential repetitive replacement control sequences in the GIOP message.

FIG. 9 shows a sample format for the next sequential repetitive replacement control sequences 60. The eight bits (0–7) of the sequential repetitive replacement control sequences 60 indicate the index of the next sequential repetitive replacement control sequence 60. The eight bits (0–7) can store values between 0 and 255, and index value of 0 indicating the end of the compression sequence.

FIG. 10 shows a second uncompressed GIOP message, containing a repetitive sequence having the decimal values 117, 111, 116, 101, 0, 205, 205. The first occurrence of the repetitive sequence of sequential value 64 occurs beginning at the eleventh byte (Row D, Col. A) in the uncompressed GIOP message 62, and the second occurrence begins at the $52^{nd}$ byte (Row 48, Col. 2).

FIG. 11 shows a GIOP message 66 compressed using repetitive sequence based compression, where the repetitive sequence of sequential values 64 of the uncompressed GIOP message 62 have been replaced with a first repetitive replacement control sequence 56, a first sequential repetitive replacement control sequence 58 and a sequential repetitive replacement control sequence 60. The first repetitive replacement control sequence 56 (Row 0, Col. 0) has a decimal value of 138 and a hexadecimal value of 8A, representing the bit string "10001010". With reference to FIG. 6, the index to the first sequential repetitive replacement control sequence 58 is determined to be 10 (i.e., "0001010"=10). Thus, the first sequential repetitive replacement control sequence 58 is found ten bytes from the first repetitive replacement control sequence 56.

The first byte (Row 0, Col. B) of the first replacement control sequence 58 has a decimal of 135 and a hexadecimal value of 87, representing the bit sequence "10000111". With reference to FIGS. 7 and 8, it can be determined that the first bit (0) is set to 1 or "high" indicating that the first sequential repetitive replacement control sequence 58 has a length of two bytes. The second byte of the first sequential repetitive replacement control sequence 58 (Row 0, Col. C) has a decimal value 40 and a hexadecimal value of 28, representing the bit string "00101000". With reference to FIG. 8, it can be determined that the second through eight bits (1–7) identify the length of the repetitive sequence of sequential value 64. The corresponding bit string "0000111" is equal to 7. It is noted that the repetitive sequence of sequential value 64 represented in FIG. 10 contains 7 bytes.

With further reference to FIG. 8, it can be determined that the remaining eight bits (8–15) of the first sequential repetitive replacement control sequence 58 identifies the index of next sequential repetitive replacement control sequence 60. This is the value stored in the second byte (Row 0, Col. C) of the first sequential repetitive replacement control sequence 58, and corresponds to the bit string "00101000" and has the decimal value 40. Thus, the next sequential repetitive replacement control sequence 60 is found forty bytes from the first sequential repetitive replacement control sequence 58 (Row 48, Col. 5) in the repetitive sequence compressed GIOP message 66. The decimal value of the sequential repetitive replacement control sequence 60 is equal to zero. With reference to FIG. 9, it can be determined that the index to the next sequential repetitive replacement control sequence 60 is equal to zero, indicating that there are no further sequential repetitive replacement control sequences.

Figure 12:
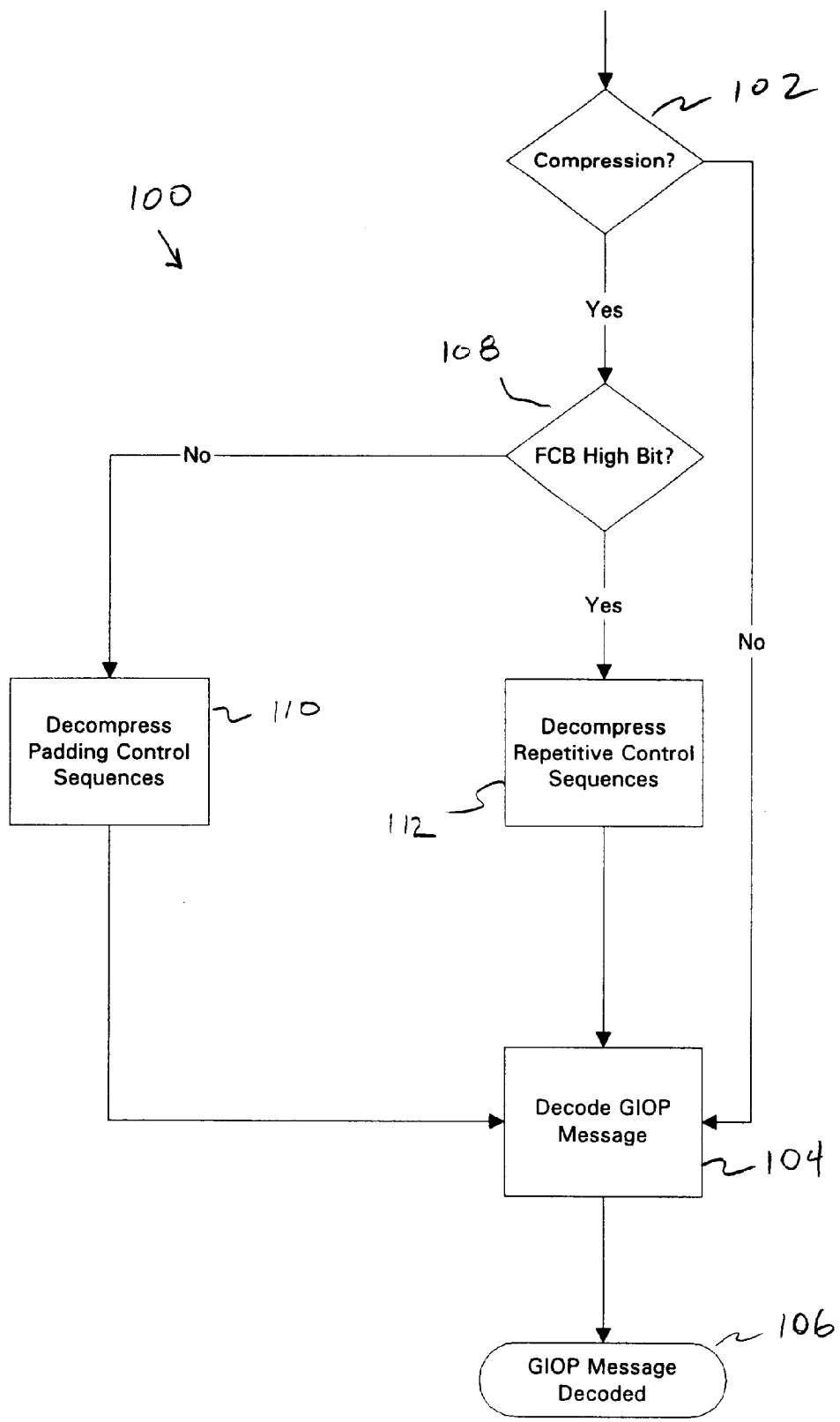
FIG. 12 is a high-level flow diagram showing a method of decompressing a compressed GIOP message employing either padding based compression or repetitive sequence based compression.

FIG. 12 is a high level flow diagram of a decompression algorithm 100 implemented by the pre-interceptor instructions 32 (FIG. 1) to decompress compressed GIOP messages 54, 66 employing either padding based compression or repetitive sequence based compression. In step 102, CPU 18 of the server 14 determines whether the incoming GIOP message 54, 66 is compressed. The CPU 18 can check the first bit (0) of the first control sequence 44, 56, or in an alternative embodiment, can check a flag in the GIOP header (not shown). In a further alternative embodiment, the CPU 18 can examine the body of the GIOP message 54, 66, determining that the message is compressed if no padding bytes and/or repetitive sequences are detected in the body of the GIOP message 54, 66.

If the GIOP message is not compressed (e.g., GIOP messages 48, 62), the CPU 18 of the server 14 decodes the GIOP message 48, 62 in step 104 in the conventional manner, resulting in a decoded GIOP message in step 106. If the CPU 18 determines that the GIOP message is compressed (e.g., GIOP messages 54, 66), the CPU 18 checks the high order bit of the first replacement control sequence 44, 56 to determine whether the received GIOP message employs padding based compression. (e.g., GIOP message 54) or repetitive sequence based compression (e.g., GIOP message 66). If the high order bit is "low", the CPU 18 determines that the GIOP message employs padding based compression, passing control to step 110 where the GIOP message 54 is uncompressed. If the high order bit of the first repetitive replacement control sequence 56 is set "high", the CPU 18 determines that the GIOP message employs repetitive sequence based compression, passing control to step 112 where the repetitive sequence compressed GIOP message 66 is decompressed. After decompressing 110, 112 the GIOP message 54, 66, the CPU 18 decodes the decompressed GIOP message 48, 62 in step 104 in the conventional manner.

Figure 13:
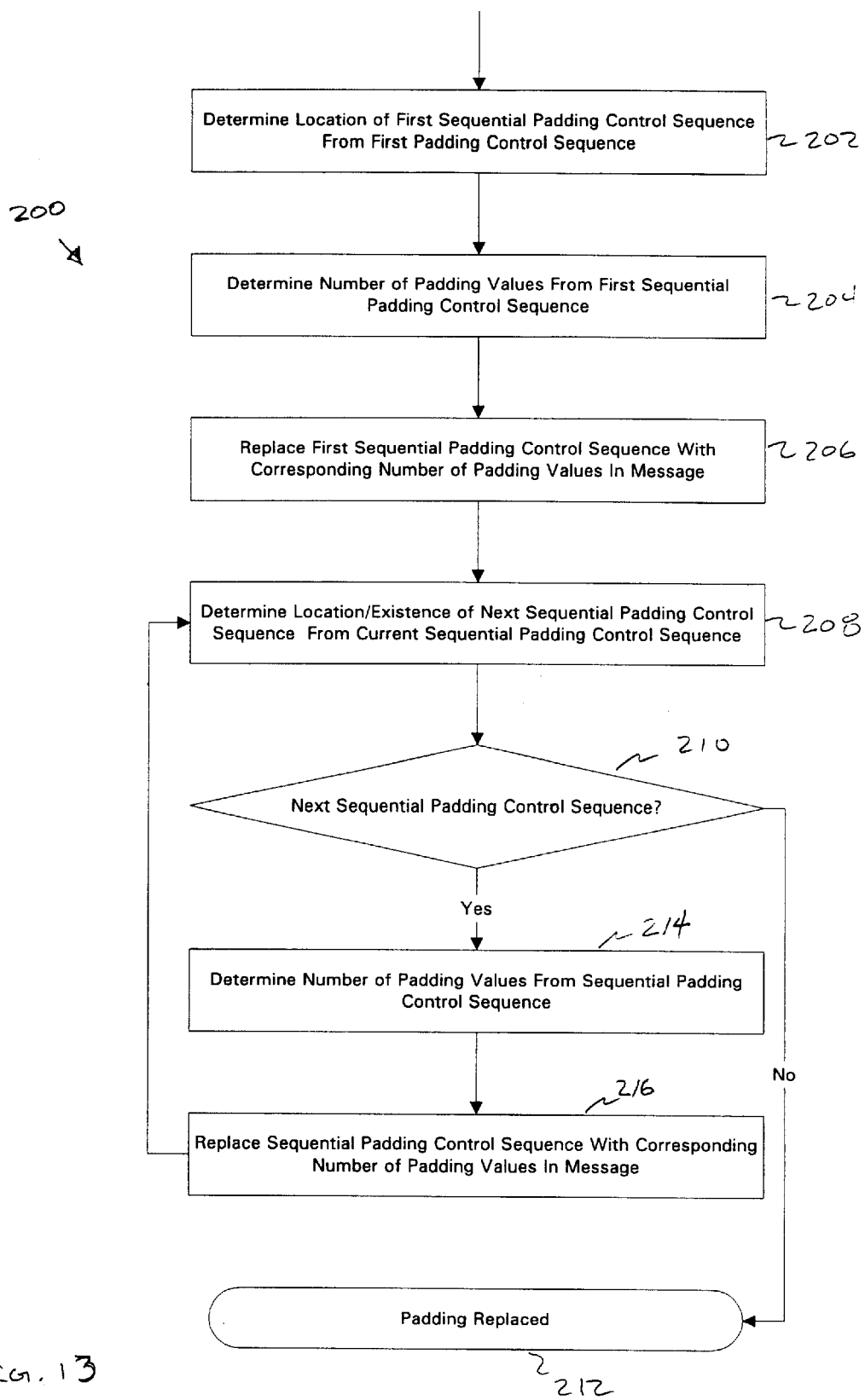
FIG. 13 is a low-level flow diagram showing a method of decompressing a compressed GIOP message employing padding based compression.

FIG. 13 is a low level flow diagram showing a method 200 of decompressing a padding based compression compressed GIOP message 54 in accordance with step 110 of FIG. 12. The padding based decompression method 200 can also be used without the steps of the method 100 (FIG. 12) where the GIOP message 54 (FIG. 5) employs only padding based compression.

In step 202, the CPU 18 of the server 14 determines the location of the first sequential padding control sequence 46 from the index in the first padding replacement control sequence 44. In step 204, the CPU 18 determines the number of sequential padding values from the first sequential padding replacement control sequence 46. In step 206, the CPU 18 replaces the first sequential padding replacement control sequence IS 46 with the corresponding number of padding values in the GIOP message.

In step 208, the CPU 18 of the server 14 determines the location and/or existence of a next sequential padding replacement control sequence 46 from the index stored in the current sequential padding control sequence 46. In step 210, the CPU 18 determines from the index whether a next sequential padding replacement control sequence 46 exists. If no further sequential padding replacement control sequences 46 exist (i.e., index=0), control passes to step 212 where the GIOP message 46 has been uncompressed by replacing the appropriate padding values into the GIOP message and by removing the padding replacement control sequences 44, 46. If a next sequential padding replacement control sequence 46 exists, control passes to step 214 where the CPU 18 determines the number of padding values from the next sequential padding replacement control sequence 46. In step 216, the CPU 18 replaces the sequential padding control sequence 46 with the corresponding number of padding values, and returns to step 208.

Figure 14:
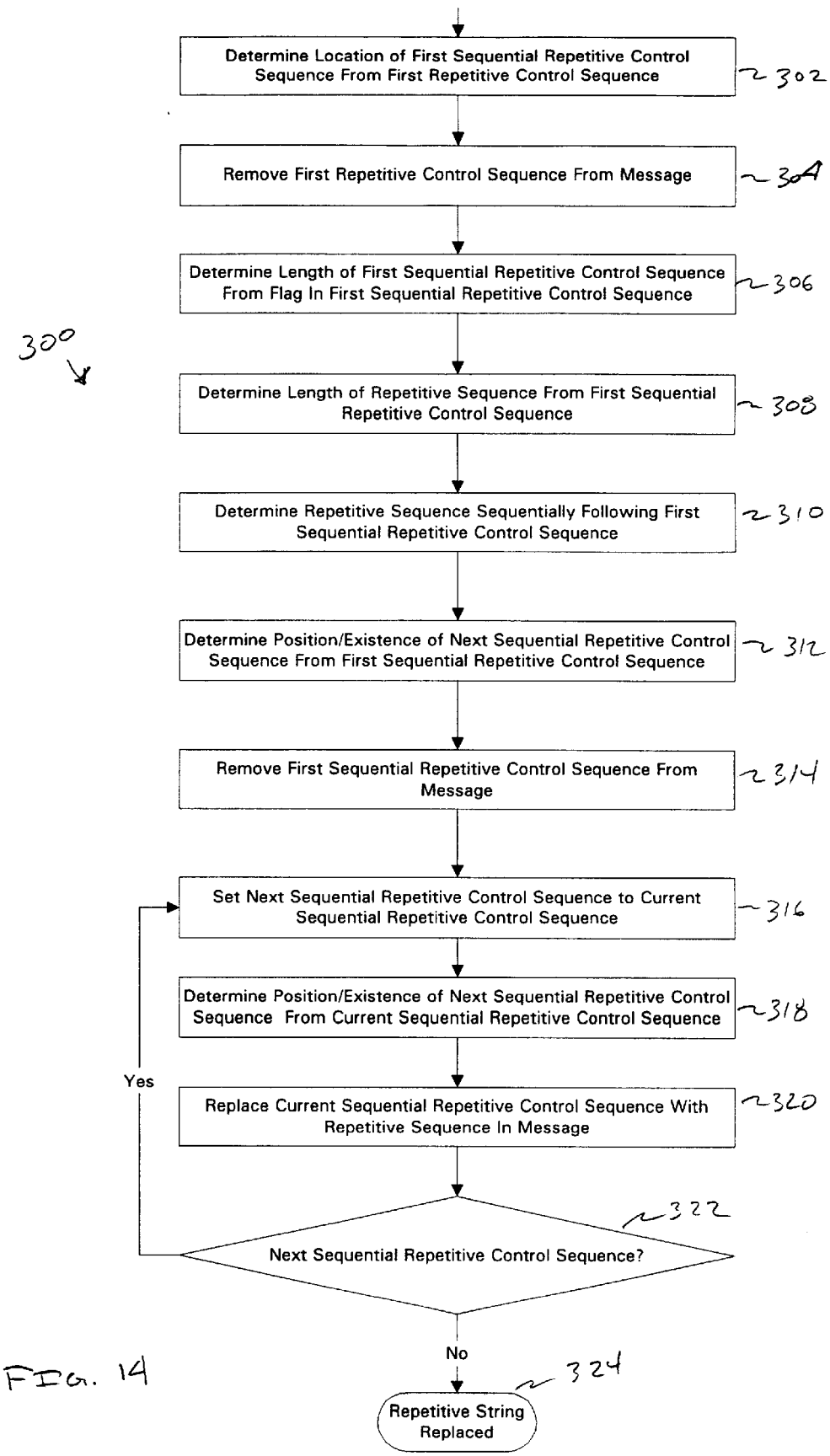
FIG. 14 is a low-level flow diagram showing a method of decompressing a compressed GIOP message employing repetitive sequence based compression.

FIG. 14 is a low level flow diagram of a method 300 of decompressing repetitive sequence based compression compressed GIOP messages 66 in accordance with step 112 of FIG. 12. The repetitive sequence based decompression method 300 can also be used without the steps of the method 100 (FIG. 12) where the GIOP message 66 employs only repetitive sequence based compression.

In step 302, the CPU 18 of the sever 14 determines the location of the first sequential repetitive replacement control sequence 58 from the first repetitive replacement control sequence 56. In step 304, the CPU 18 removes the first repetitive replacement control sequence from the GIOP message 66. In step 306, the CPU 18 determines the length of the first sequential repetitive replacement control sequence 58 from the flag (e.g., high order bit) stored in the first sequential repetitive replacement control sequence 58. The compression/decompression scheme can employ different length first sequential repetitive replacement control sequences 58, as shown in FIGS. 7 and 8.

In step 308, the CPU 18 of the server 14 determines the length of the repetitive sequence of sequential values 64 from the first sequential repetitive replacement control sequence 58. In step 310, the CPU 18 determines the sequential values of the repetitive sequence of sequential values 64 that follow the first sequential repetitive replacement control sequence 58. In step 312, the CPU 18 determines the value of the index to the next sequential repetitive replacement control sequence 60 from the first sequential repetitive replacement control sequence 58. In step 314, CPU 18 removes the first sequential repetitive replacement control sequence 58 from the GIOP message 66.

In step 316, the CPU 18 sets the next sequential repetitive replacement control sequence 60 to be the current sequential repetitive replacement control sequence. In step 318, the CPU 18 determines the value of the index of the next sequential repetitive replacement control sequence 60 from the current sequential repetitive replacement control sequence. In step 320, the CPU 18 replaces the current sequential repetitive replacement control sequence with the appropriate repetitive sequence of sequential values 64. In step 322, the CPU 18 determines from the index whether a next sequential repetitive replacement control sequence 60 exists. If the index is equal to zero, no further sequential repetitive replacement control sequences exist and the CPU 18 passes control to step 324, where the CPU 18 has replaced the repetitive strings or sequences of sequential values to create the uncompressed GIOP message 62 from the reptitive sequence based compression compressed GIOP message 54. If, however, a next sequential repetitive replacement control sequence 60 exists, the CPU 18 passes control to step 316 and repeats the process.

Figure 15:
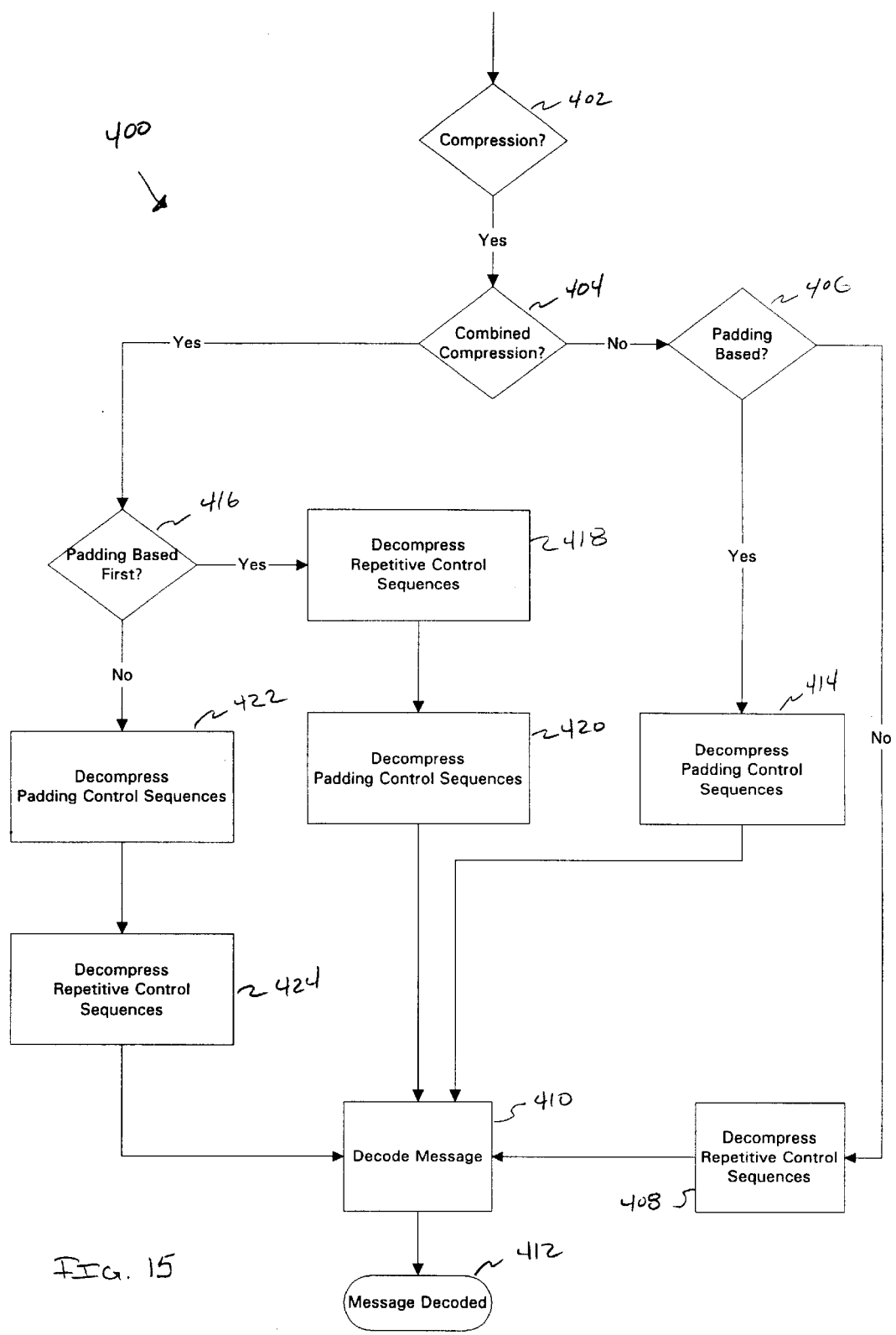
FIG. 15 is a high-level flow diagram showing a method of decompressing a compressed GIOP message employing either, or both, padding and repetitive sequence based compression.

FIG. 15 is a high level flow diagram showing a method 400 of decompressing GIOP messages compressed with either and/or both padding based compression and repetitive sequence based compression. It is noted that it is preferable to perform repetitive based compression prior to the padding based compression to achieve a more efficiently compressed GIOP message. In such a case, the method 400 can be simplified by eliminating steps 416, 422 and 424 (discussed below), where the result of determining that the GIOP message employs combined compression (step 404) is to pass control directly to step 418 (discussed below).

In step 402, the CPU 18 of the server 14 determines whether the GIOP message 54, 66 employs compression. Such techniques are generally described above. If the GIOP message 54, 66 is compressed, the CPU 18 determines in step 404 whether the GIOP message 54, 66 employs combined compression. If the compressed GIOP message 54, 66 does not employ combined compression, the CPU 18 determines whether the GIOP message is a padding based compression compressed GIOP message in step 406. If the CPU 18 determines that the GIOP message is not a padding based compression compressed GIOP message 54, the CPU 18 passes control to step 408, where the repetitive sequence based compression compressed GIOP message 66 is decompressed in a fashion similar to that set out in FIG. 14. The CPU 18 then decodes the decompressed GIOP message 62 in step 410, resulting in a decoded message in step 412. If however, the GIOP message is a padding based compression compressed GIOP message 54, the CPU 18 passes control to step 414 where the padding compressed GIOP message 54 is decompressed in the manner disclosed in FIG. 13.

If the CPU 18 of the server 14 determines that the GIOP message employs combined compression in step 404, control passes to step 416, where the CPU 18 determines whether the compressed GIOP message 54, 66 was compressed using padding based compression prior to repetitive based compression. If repetitive based compression occurred first, control is passed to step 418 where the CPU 18 decompresses the GIOP message in a similar fashion to that set out in FIG. 14. In step 420, the CPU 18 applies padding based decompression to the partially decompressed GIOP message. In step 410, the fully decompressed GIOP message 48, 62 is decoded in the conventional manner.

If padding based compression occurred first, control passes from step 416 to step 422, where the CPU 18 of the server 14 decompresses the GIOP message in the fashion disclosed in FIG. 13. In step 424, the CPU 18 applies repetitive sequence decompression to the partially decompressed message in the manner shown in FIG. 14. Again, the fully decompressed GIOP message 48, 62 is decoded in step 410.

Figure 16:
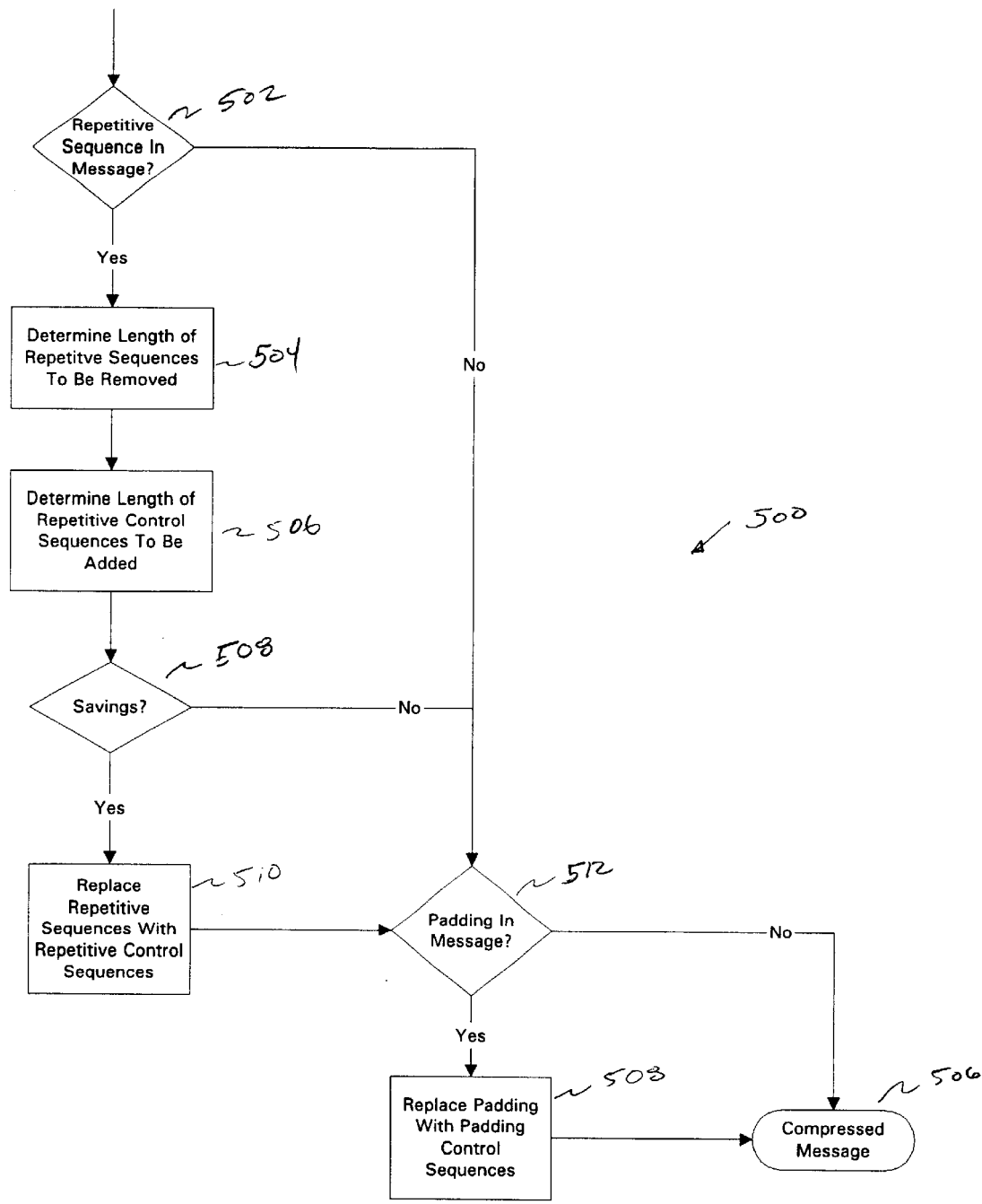
FIG. 16 is a low-level flow diagram showing a method of compressing a GIOP message employing repetitive sequence based compression followed by padding based compression.

FIG. 16 is a high level flow diagram of a compression method 500 to apply repetitive sequence based compression to a GIOP message 48, 62, followed by padding based compression. As noted earlier, having padding based compression follow the repetitive sequence compression can result in a more efficiently compressed message than would result from padding based compression followed by repetitive sequence based compression. Thus, while FIG. 15 sets out a preferred method, it is possible to perform padding based compression before repetitive sequence based compression as set out in FIG. 19, discussed below.

In step 502, the CPU 18 of the client computing device 12 determines if the uncompressed GIOP message 48, 62 contains any repetitive sequences of sequential values 64. If repetitive sequences are found, the CPU 18 determines the length of the repetitive sequences that would be removed through repetitive sequence compression in step 510. In step 512, the CPU 18 determines the length of the repetitive control sequences that would be to compress the GIOP message through repetitive sequenced based compression. In step 514, the CPU 18 determines whether repetitive sequence based compression will result in a message length savings. If a savings in message length will result, the CPU 18 of the client computing device 12, in step 516, replaces the repetitive sequences of sequential values 64 with repetitive replacement control sequences 56, 58, 60, and passes control to step 504. If a savings will not result, the CPU 18 of the client computing device 12 passes control directly to step 512 to determine whether the GIOP message 48, 62 contains padding values. If the GIOP message contains padding values, the CPU 18 replaces the padding values with padding replacement control sequences 44, 46 in step 508, resulting a compressed GIOP message 54, 66 in step 506. It the GIOP message 48, 62 does not contain padding values, the CPU 18 passes control directly to step 506.

Figure 17:
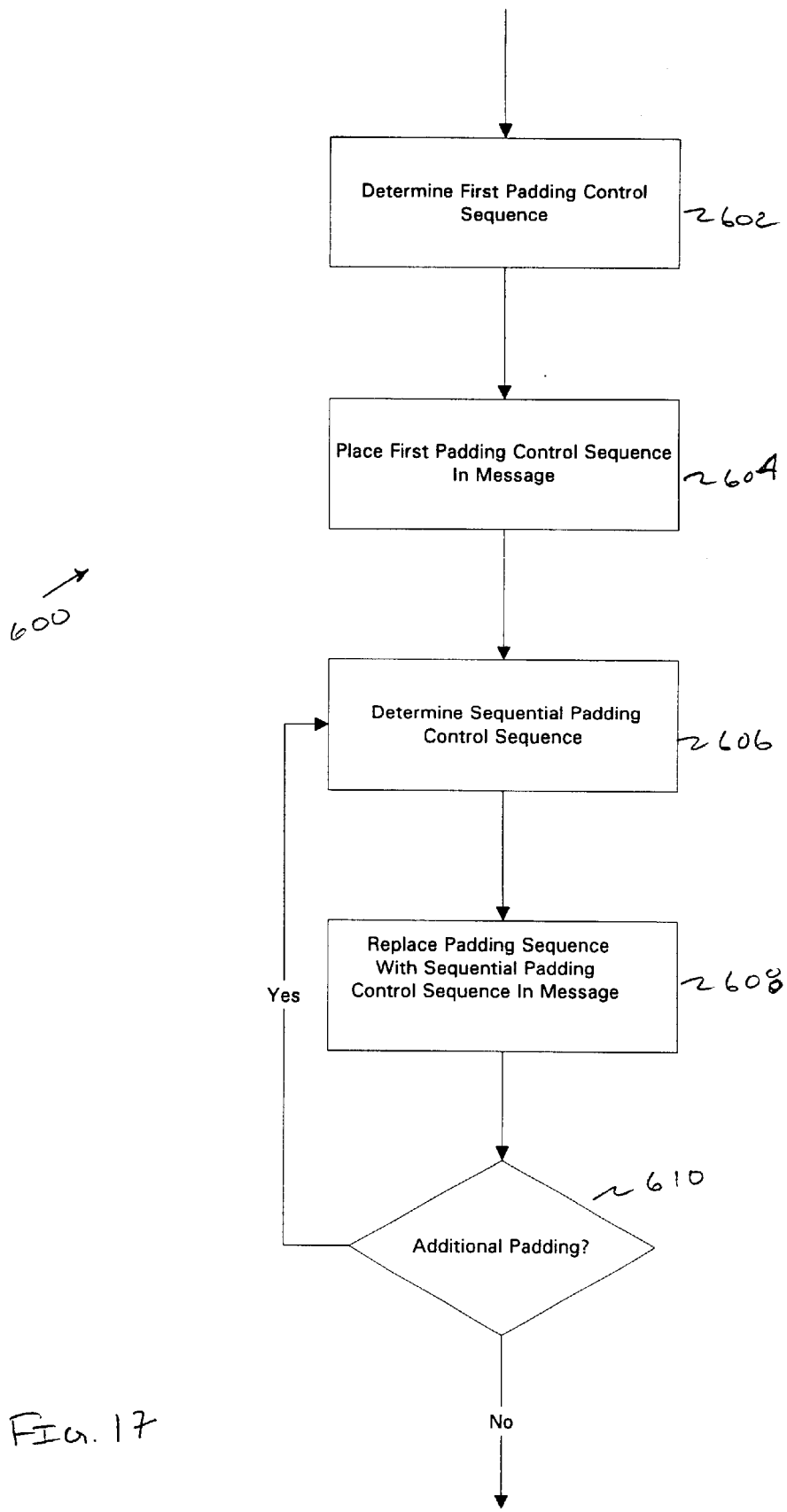
FIG. 17 is a low-level flow diagram showing a method of compressing a GIOP message employing padding based compression.

FIG. 17 is a low level flow diagram of a padding based compression method 600. The CPU 18 of the client computing device 12 can execute the padding based compression method 600 to perform the step 508 of the method 500 (FIG. 16). Alternatively, the CPU 18 can execute the padding based compression method 600 without the steps of the method 500, where the compressed GIOP message 54 employs only padding based compression.

In step 602, the CPU 18 of the client computing device 12 determines the first padding replacement control sequence 44. In step 604, the CPU 18 places the first padding replacement control sequence 44 into the message. In step 606, the CPU 18 determines the sequential padding replacement control sequence 46. In step 608, the CPU 18 replaces the padding sequence (i.e., bytes having a zero value) with the corresponding sequential padding replacement control sequence 46 in the GIOP message 48. In step 610, the CPU 18 determines whether the GIOP message 48 contains additional padding values. If the message contains additional padding values, the CPU 18 passes control back to step 606. If the GIOP message does not contain additional padding values, the CPU 18 exits the padding based compression routine 600.

Figure 18:
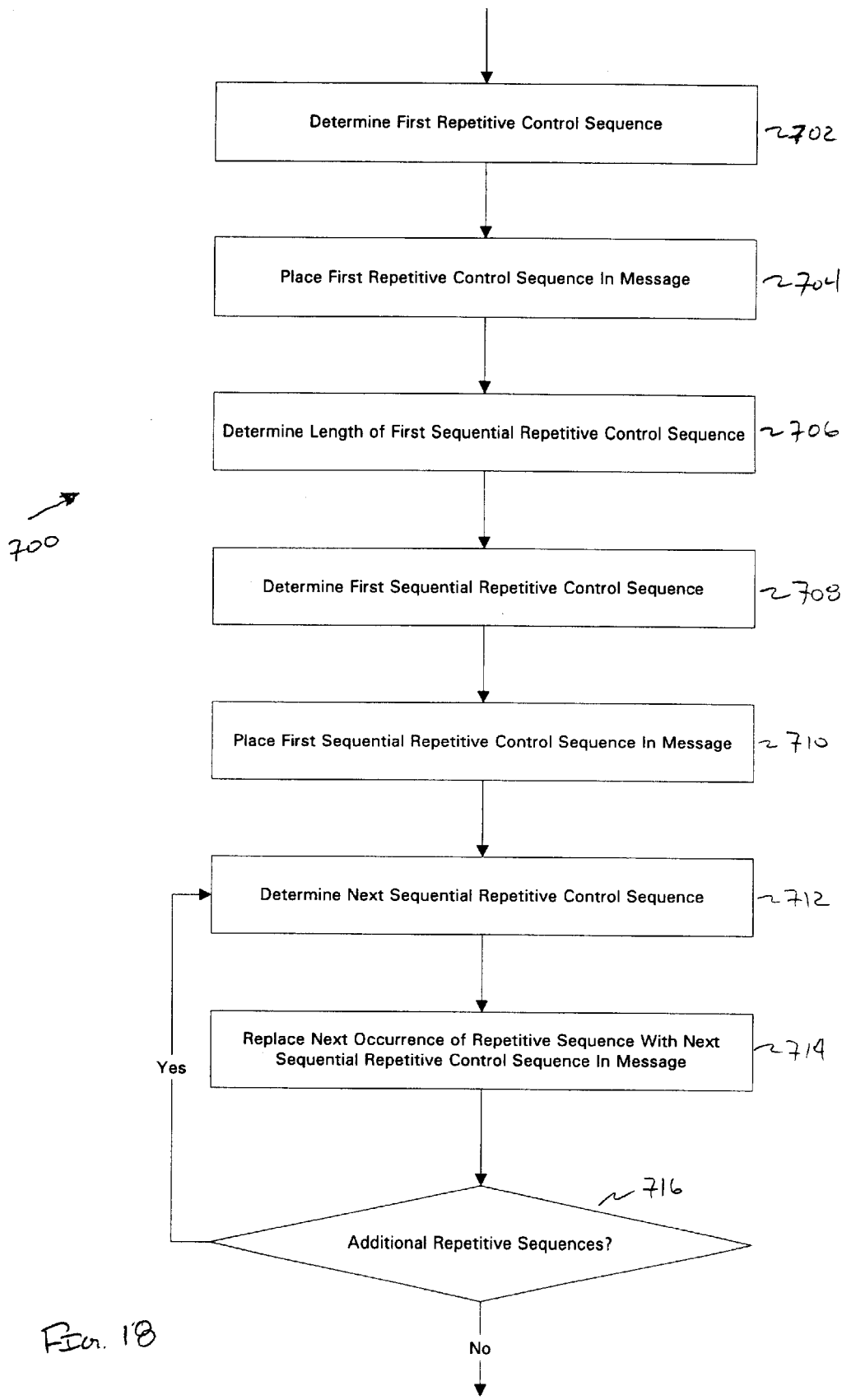
FIG. 18 is a low-level flow diagram showing a method of compressing a GIOP message employing repetitive sequence based compression.

FIG. 18 is a low level flow diagram of a repetitive sequence based compression method 700. The CPU 18 of the client computing device 12 can execute the repetitive sequence based compression method 700 to perform the step 510 of the method 500 (FIG. 16). Alternatively, the CPU 18 can execute the repetitive sequence based compression method 700 without the steps of the method 500, where the compressed GIOP message 66 employs only repetitive sequence based compression.

In step 702, the CPU 18 of the client computing device 12 determines the first repetitive replacement control sequence 56. In step 704, the CPU 18 of the client computing device 12 replaces the first repetitive replacement control sequence 56 into the GIOP message 62. In step 706, the CPU 18 determines the length of the first sequential repetitive replacement control sequence 58. For example, the first sequential repetitive replacement control sequence may be one byte or two bytes in length (FIGS. 7 and 8).

In step 708, the CPU 18 of the client computing device 12 determines the first sequential repetitive replacement control sequence 58. In step 710, the CPU 18 places the first sequential repetitive replacement control sequence 58 in the GIOP message. In step 712, the CPU 18 determines the next sequential repetitive replacement control sequence 60. In step 714, the CPU 18 replaces the next occurrence of the repetitive sequence of sequential values 64 with the next sequential repetitive replacement control sequence 60 in the GIOP message 62. In step 716, the CPU 18 determines whether there are additional repetitive sequences of sequential values 64 in the GIOP message 62. If additional repetitive sequences of sequential values 64 are found, control passes back to step 712, otherwise the routine 700 terminates.

Figure 19:
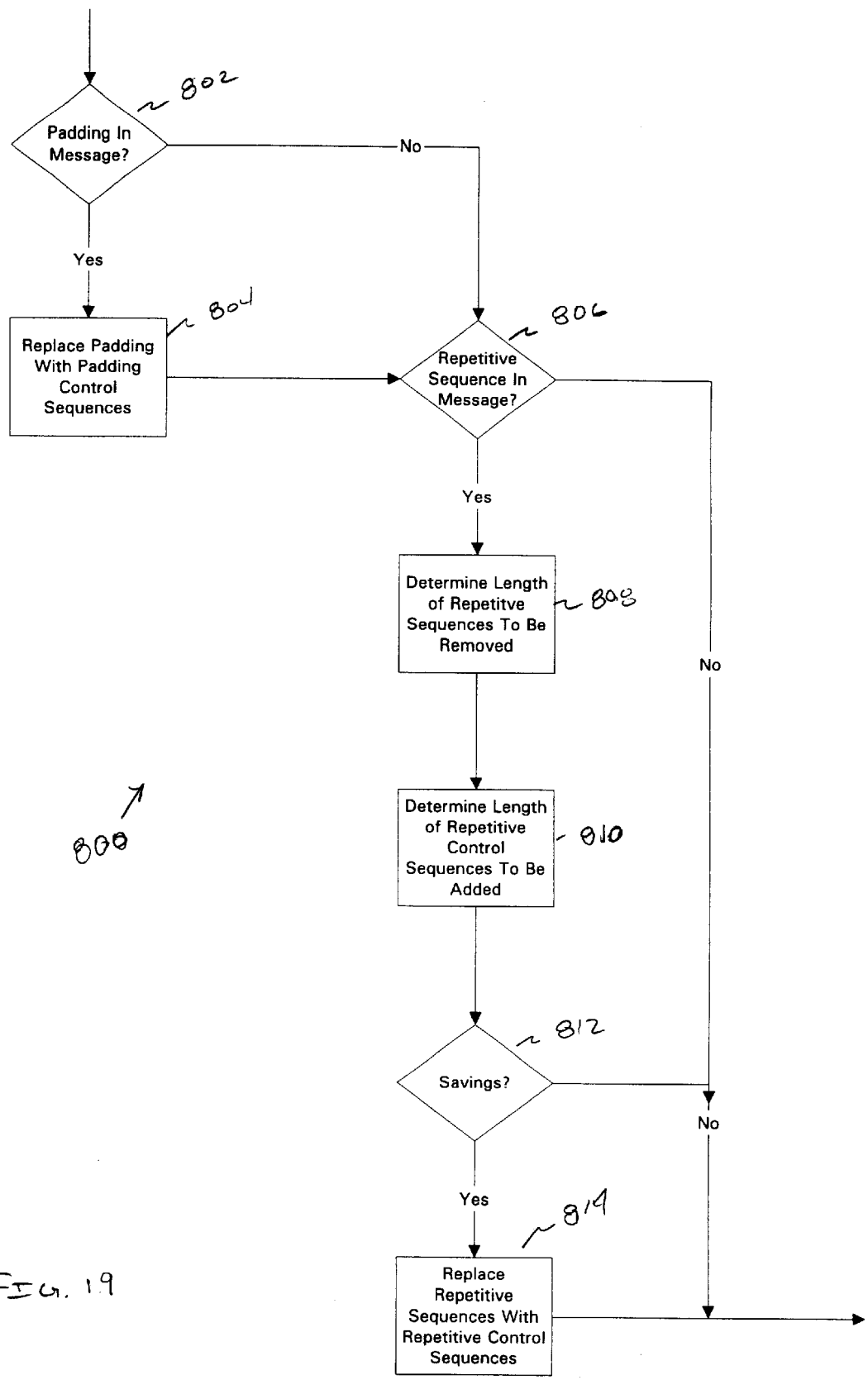
FIG. 19 is a high-level flow diagram showing a method of compressing a GIOP message employing padding based compression followed by repetitive sequence based compression.

FIG. 19 is a high level flow diagram of a method of combined compression 800, where repetitive sequence based compression follows padding based compression. In step 802, the CPU 18 of the client computing device 12 determines whether the uncompressed GIOP message 48, 62 contains padding values (i.e., bytes having a zero value). If padding values are found, the CPU 18 replaces the padding values with the padding replacement control sequences 44, 46 in step 804, and passes control to step 806. The CPU 18 can executed the padding based decompression method 600 (FIG. 17), described earlier, to perform the step 804. If padding values are not found, the CPU 18 passes control directly to step 806, where the CPU 18 determines whether the GIOP message 48, 62 contains repetitive sequences of sequential values 64.

If the GIOP message 48, 62 does not contain repetitive sequences of sequential values 64, the routine 800 terminates. If the GIOP message 48, 62 does contain repetitive sequences of sequential values 64, the CPU 18 passes control to step 808 and determines the length of the repetitive sequences 64 that would be removed through repetitive sequence based compression. In step 810, the CPU 18 of the cleint computing device 12 determines the length of the repetitive control sequences 56, 58, 60 that repetitive sequence based compression would add to compress the GIOP message 48, 62. In step 812, the CPU 18 determines whether a savings in message length will result from compression. If a message length savings will not result, the routine 800 terminates. If a message length savings will result, the CPU 18 replaces the repetitive sequences of sequential values 64 with the repetitive replacement control sequences 56, 58, 60, in step 814. The CPU 18 of the client computing device 12 can execute the repetitive sequence decompression method 700 (FIG. 18), described earlier to perform step 814.

Although specific embodiments of, and examples for the invention are described herein for illustrative purposes, various equivalent modifications can be made without departing from the spirit and scope of the invention, as will be recognized by those skilled in the relevant art. The teachings provided herein of the invention can be applied other object based networked computing protocols, not necessarily the exemplary GIOP protocol generally described above.

The various embodiments described above can be combined to provide further embodiments. For example, a high level decompression method can distinguish between compressed GIOP messages employing repetitive based compression before padding based compression and GIOP messages employing padding based compression before repetitive based compression. The system can employ padding based compression/decompression without repetitive based compression/decompression. The system can also employ repetitive based compression or without padding based compression. The system can also employ additional compression/decompression schemes. Aspects of the invention can be modified, if necessary, to employ systems, circuits and concepts of the various patents, applications and publications to provide yet further embodiments of the invention. Further, the system can employ networks other than the exemplary Internet based embodiment described above.

These and other changes can be made to the invention in light of the above detailed description. In general, in the following claims, the terms used should not be construed to limit the invention to the specific embodiments disclosed in this specification of the claims, but should be construed to include all computers and networks that operate in accordance with the claims. Accordingly, the invention is not limited by the disclosure, but instead its scope is to be determined entirely by the following claims.

I claim:

1. A method in a data processing system for automatically compressing a GIOP (generic inter-orb protocol) message, comprising inserting a first padding replacement control sequence in the message, the first padding replacement control sequence indicating a position of a first one of a number of sequential padding replacement control sequences; and for each of a number of padding sequences comprising at least two consecutive padding values in the message, replacing the padding sequence with a respective one of the number of sequential padding replacement control sequences, each of the sequential padding replacement control sequences indicating a number of padding values in the corresponding padding sequence and a position of a next one of the sequential padding replacement control sequences, if any.

2. The method of claim 1 wherein each of the sequential padding replacement control sequences is of a same predetermined length.

3. The method of claim 1 wherein a length of each of the sequential padding replacement control sequences is one byte.

4. The method of claim 1, further comprising:
determining the first padding replacement control sequence.

5. The method of claim 1, further comprising:
for each of the padding sequences comprising at least two consecutive padding values, determining the respective sequential padding replacement control sequence.

6. The method of claim 1, further comprising:
for each of the padding sequences comprising at least two consecutive padding values, determining the respective sequential padding replacement control sequence, by:
determining the number of padding values in the corresponding padding sequence; and
determining the position of a next one of the sequential padding replacement control sequences.

7. The method of claim 1, further comprising:
for each of the padding sequences comprising at least two consecutive padding values, determining the sequential padding replacement control sequence, by:
determining the number of padding values in the corresponding padding sequence; and
determining an offset to a next one of the sequential padding replacement control sequences.

8. The method of claim 1, further comprising:
setting a value in the sequential padding replacement control sequence that represents the position of the next one of the sequential padding replacement control sequences to a null value if there is no further padding sequences in the message.

9. The method of claim 1 wherein the message includes one or more data values between each successive pair of the sequential padding replacement control sequences.

10. The method of claim 1, further comprising:
setting a flag in the first padding replacement control sequence in the message to indicate that the padding values have been removed from the message.

11. The method of claim 1, further comprising:
identifying at least a first repetitive sequence of sequential values occurring at least twice in the message after replacing the padding sequences with the respective ones of the number of sequential padding replacement control sequences;
inserting a first repetitive replacement control sequence into the message identifying a position of a first one of a number of sequential repetitive replacement control sequences;
inserting the first one of the sequential repetitive replacement control sequences into the message sequentially preceding a first occurrence of the first repetitive sequence of sequential values in the message, the first sequential repetitive replacement control sequence identifying a length of the first repetitive sequence of sequential values and identifying a position of a next one of the sequential repetitive replacement control sequences; and
for each additional occurrence of the first repetitive sequence of sequential values in the message, replacing the occurrence of the first repetitive sequence with a respective one of the number of additional sequential repetitive replacement control sequences, the additional sequential repetitive replacement control sequences each identifying a position of a next one of the sequential repetitive replacement control sequences, if any.

12. A computer-readable medium whose contents cause a computer system to automatically compress a GIOP message by:
inserting a first padding replacement control sequence in the message, the first padding replacement control sequence indicating a position of a first one of a number of sequential padding replacement control sequences; and
for each of a number of padding sequences comprising at least two consecutive padding values in the message, replacing the padding sequence with a respective one of the number of sequential padding replacement control sequences, each of the sequential padding replacement control sequences indicating a number of padding values in the corresponding padding sequence and position of a next one of the sequential padding replacement control sequences, if any.

13. The computer-readable medium of claim 12, whose contents cause the computer system to automatically compress the GIOP message further by:
for each of the padding sequences comprising at least two consecutive padding values, determining the sequential padding replacement control sequence, by:
determining the number of padding values in the corresponding padding sequence; and
determining an offset to a next one of the sequential padding replacement control sequences.

14. A system for automatically compressing GIOP messages, comprising:
a padding identification subsystem that identifies at least one padding character in a message;
a padding replacement control sequence subsystem that inserts a first padding replacement control sequence in the message, the first padding replacement control sequence indicating a position of a first one of a number of sequential padding replacement control sequences, and that, for each of a number of padding sequences comprising at least two consecutive padding values in the message, replaces the padding sequence with a respective one of the number of sequential padding replacement control sequences, each of the sequential padding replacement control sequences indicating a number of padding values in the corresponding padding sequence and a position of a next one of the sequential padding replacement control sequences, if any.

15. A computer memory containing a data structure in the form of a compressed GIOP message, the data structure comprising:
a header; and
a body, the body comprising:
a first padding replacement control sequence in the message, the first padding replacement control sequence indicating a position of a first one of a number of sequential padding replacement control sequences; and
at least the first one of the number of sequential padding replacement control sequences, each of the sequential padding replacement control sequences indicating a number of padding values in a corresponding padding sequence removed from the body of the message, and further indicating a position of a next one of the sequential padding replacement control sequences, if any.

16. A method in a data processing system for automatically decompressing a GIOP message, comprising:
determining from a first padding replacement control sequence in a message, a position of a first one of a number of sequential padding replacement control sequences;

determining from each of the number of sequential padding replacement control sequences a number of padding values in a respective padding sequence and a position of a next one of the sequential padding replacement control sequences, if any; and for each of the number of sequential padding replacement control sequences, replacing the sequential padding replacement control sequence in the message with the respective padding sequence comprising a number of the padding values equal to the number indicated by the sequential padding replacement control sequence that is being replaced.

17. The method of claim 16 wherein each of the sequential padding replacement control sequences is of a same predetermined length.

18. The method of claim 16 wherein determining from each of the number of padding replacement control sequences the position of the next one of the sequential padding replacement control sequences includes determining an offset to the next one of the sequential padding replacement control sequence.

19. The method of claim 16, further comprising:
first determining that a message is in a compressed form.

20. The method of claim 16, further comprising:
first checking a flag in the first padding replacement control sequence in the message for an indication that the padding values have been removed from the message.

21. A computer-readable medium whose contents cause a computer system to automatically decompress a GIOP message by:

determining from a first padding replacement control sequence in a message, a position of a first one of a number of sequential padding replacement control sequences;

determining from each of the number of sequential padding replacement control sequences a number of padding values in a respective padding sequence and a position of a next one of the sequential padding replacement control sequences, if any; and for each of the number of sequential padding replacement control sequences, replacing the sequential padding replacement control sequence in the message with the respective padding sequence comprising a number of the padding values equal to the number indicated by the sequential padding replacement control sequence that is being replaced.

22. A system for automatically compressing GIOP messages, comprising:

a compression detection subsystem that determines that message is in a compressed form;

a deciphering subsystem that determines from a first padding replacement control sequence in the message, a position of a first one of a number of sequential padding replacement control sequences, and that determines from each of the number of sequential padding replacement control sequences a number of padding values in a respective padding sequence and a position of a next one of the sequential padding replacement control sequences, if any; and a message reconstruction subsystem that for each of the number of sequential padding replacement control sequences, replaces the sequential padding replacement control sequence in the message with the respective padding sequence comprising a number of the padding values equal to the number indicated by the sequential padding replacement control sequence that is being replaced.

23. A method in a data processing system for automatically compressing GIOP messages, comprising:

identifying at least a first repetitive sequence of sequential values occurring at least twice in a message;

inserting a first repetitive replacement control sequence into the message identifying a position of a first one of a number of sequential repetitive replacement control sequences;

inserting the first one of the sequential repetitive replacement control sequences into the message sequentially preceding a first occurrence of the first repetitive sequence of sequential values in the message, the first sequential repetitive replacement control sequence identifying a length of the first repetitive sequence of sequential values and identifying a position of a next one of the sequential repetitive replacement control sequences; and for each additional occurrence of the first repetitive sequence of sequential values in the message, replacing the occurrence of the first repetitive sequence with a respective one of the number of additional sequential repetitive replacement control sequences, the additional sequential repetitive replacement control sequences each identifying a position of a next one of the sequential repetitive replacement control sequences, if any.

24. The method of claim 23, further comprising:
setting a length of the first sequential repetitive replacement control sequence as n bits, if a length of the first repetitive sequence is not greater than $2^i-1$ and if the identification of the position of the next sequential repetitive replacement control sequence is not greater than $2^j-1$, where i is the number of bits in the first sequential repetitive replacement control sequence that represent the length of the repetitive sequence and j is the number of bits in the first sequential repetitive replacement control sequence that represent the position of the next sequential repetitive replacement control sequence, i and j being integers whose sum is equal to n−1; and setting the length of the first sequential repetitive replacement control sequence as 2n, if either the length of the first repetitive sequence is greater than $2^i-1$, or the identification of the position of the next sequential repetitive replacement control sequence is greater than $2^j-1$.

25. The method of claim 23, further comprising:
setting a length of the first sequential repetitive replacement control sequence as one byte, if a length of the first repetitive sequence is not greater than $2^i-1$ and if an offset identifying the position of the next sequential repetitive replacement control sequence is not greater than $2^j-1$, where i is the number of bits in the first sequential repetitive replacement control sequence that represent the length of the first repetitive sequence and j is the number of bits in the first sequential repetitive replacement control sequence that represent the position of the next sequential repetitive replacement control sequence, i and j being integers whose sum is equal to one less than the number of bits in one byte; and setting the length of the first sequential control sequence as two bytes, if either the length of the first repetitive sequence is greater than $2^i-1$, or the offset identifying the position of the next sequential repetitive replacement control sequence is greater than $2^j-1$.

26. The method of claim 23, further comprising:
setting a length of the first sequential repetitive replacement control sequence to one byte if a length of the first repetitive sequence is not greater than seven bytes and the distance between the first sequential repetitive replacement control sequence and the next sequential repetitive replacement control sequence is not greater than sixteen bytes; and
setting the length of the first sequential repetitive replacement control sequence to two bytes if either the length of the first repetitive sequence is greater than seven bytes or the distance between the first sequential repetitive replacement control sequence and the next sequential repetitive replacement control sequence is greater than sixteen bytes.

27. The method of claim 26, further comprising:
setting a flag bit in the first sequential repetitive replacement control sequence to contain one of the values "1" or "0" if the length of the first sequential repetitive replacement control sequence is one byte, and setting the flag bit in the first sequential repetitive replacement control sequence to contain the other of the values "1" or "0" if the length of the first sequential repetitive replacement control sequence is two bytes.

28. The method of claim 23 wherein for each of the sequential repetitive replacement control sequences, the identification of the position of the next one of the sequential repetitive replacement control sequences is given as an offset from the occurrence of the previous sequential repetitive replacement control sequence.

29. The method of claim 23, further comprising:
setting the additional sequential repetitive replacement control sequence equal to a null value if there is no further first repetitive sequences in the message.

30. The method of claim 23, further comprising:
determining that the replacement of the occurrences of the first repetitive sequence with the first repetitive replacement control sequence and the sequential repetitive replacement control sequences will shorten the message before inserting the first repetitive replacement control sequence and the sequential repetitive replacement control sequences into the message;
identifying a second repetitive sequence of sequential values occurring at least twice in a message;
determining that the replacement of the occurrences of the second repetitive sequence with a respective first repetitive replacement control sequence and a number of respective sequential repetitive replacement control sequences will not shorten the message; and
leaving the occurrences of the second repetitive sequences of sequential values in the message.

31. The method of claim 23 wherein the identifying at least a first repetitive sequence of sequential values occurring in the message occurs during a first pass through the message, and the inserting a first repetitive replacement control sequence, the inserting the first sequential repetitive replacement control sequence and the replacing of the additional occurrences of the first repetitive sequence with respective additional sequential repetitive replacement control sequences occur during a second pass through the message, only after determining that a shorter message will result.

32. The method of claim 23 wherein inserting a first repetitive replacement control sequence into the message includes inserting the first repetitive replacement control sequence at a predetermined location in the message.

33. The method of claim 23 wherein the additional sequential repetitive replacement control sequences only identify the position of the next one of the sequential repetitive replacement control sequences, if any.

34. The method of claim 23, further comprising:
setting a flag in the first repetitive replacement control sequence in the message to indicate that at least one occurrence of the first repetitive sequence has been removed from the message.

35. The method of claim 23, further comprising:
inserting a first padding replacement control sequence in the message after replacing the occurrences of the first repetitive sequence with the respective sequential repetitive replacement control sequences, the first padding replacement control sequence indicating a position of a first one of a number of sequential padding replacement control sequences; and
for each of a number of padding sequences comprising at least two consecutive padding values in the message, replacing the padding sequence with a respective one of the number of sequential padding replacement control sequences, each of the sequential padding replacement control sequences indicating a number of padding values in the corresponding padding sequence and a position of a next one of the sequential padding replacement control sequences, if any.

36. A computer-readable medium whose contents cause a computer system to automatically compress a GIOP message by:
identifying at least a first repetitive sequence of sequential values occurring at least twice in a message;
inserting a first repetitive replacement control sequence into the message identifying a position of a first one of a number of sequential repetitive replacement control sequences;
inserting the first one of the sequential repetitive replacement control sequences into the message sequentially preceding a first occurrence of the first repetitive sequence of sequential values in the message, the first sequential repetitive replacement control sequence identifying a length of the first repetitive sequence of sequential values and identifying a position of a next one of the sequential repetitive replacement control sequences; and
for each additional occurrence of the first repetitive sequence of sequential values in the message, replacing the occurrence of the first repetitive sequence with a respective one of the number of additional sequential repetitive replacement control sequences, the additional sequential repetitive replacement control sequences each identifying a position of a next one of the sequential repetitive replacement control sequences, if any.

37. A system for automatically compressing GIOP messages, comprising:
a repetitive sequence identification subsystem that identifies at least a first repetitive sequence of sequential values occurring at least twice in a message;
a repetitive replacement control sequence subsystem that inserts a first repetitive replacement control sequence into the message identifying a position of a first one of a number of sequential repetitive replacement control sequences;
a sequential repetitive replacement control sequence subsystem that inserts the first one of the sequential repetitive replacement control sequences into the message sequentially preceding a first occurrence of the first repetitive sequence of sequential values in the message, the first sequential repetitive replacement control sequence identifying a length of the first repetitive sequence of sequential values and identifying a position of a next one of the sequential repetitive replacement control sequences; and that, for each additional occurrence of the first repetitive sequence of sequential values in the message, replaces the occurrence of the first repetitive sequence with a respective one of the number of additional sequential repetitive replacement control sequences, the additional sequential repetitive replacement control sequences each identifying a position of a next one of the sequential repetitive replacement control sequences, if any.

38. A computer memory containing a data structure in the form of a compressed GIOP message, the data structure comprising:
   a header; and
   a body, the body comprising:
      a first repetitive replacement control sequence in the message, the first repetitive replacement control sequence indicating a position of a first one of a number of sequential repetitive replacement control sequences;
      the first one of the sequential replacement control sequences in the message, the first one of the sequential replacement control sequence indicating a length of a first repetitive sequence of sequential values, and indicating a position of a next one of the sequential repetitive replacement control sequences;
      the first repetitive sequence of sequential values sequentially following the first one of the sequential replacement control sequences; and
      at least the next one of the number of sequential replacement control sequences.

39. A method in a data processing system for automatically decompressing GIOP messages, comprising:
   determining from a first control sequence in a message, a position of a first one of a number of sequential control sequences in the message;
   determining from the first one of the number of sequential control sequences, a length of a first repetitive sequence of sequential values in the message and a position of a next one of the number of sequential control sequences;
   determining each of the values of the first repetitive sequence of sequential values based on the determined length of the first repetitive sequence of sequential values;
   for each of the other sequential control sequences in the message, determining from the sequential control sequence a position of a next one of the number of sequential control sequences, if any;
   removing the first control sequence from the message;
   removing the first sequential control sequence from the message; and
   for each occurrence of the other sequential control sequences, replacing the sequential control sequence with each of the determined values of the first repetitive sequence of sequential values.

40. The method of claim 39, further comprising:
   checking a flag in the first sequential control sequence to determine a length of the first sequential control sequence.

41. The method of claim 39 wherein determining a length of a first repetitive sequence of sequential values in the message, comprises:
   determining a length of the first one of the number of sequential control sequences; and
   setting the length of the first repetitive sequence equal to a value of a first number of bits of the first one of the number of sequential control sequences if the length of the first sequential control sequence is equal to a first predetermined length, and setting the length of the first repetitive sequence equal to a value of a second number of bits of the first one of the number of sequential control sequences if the length of the first sequential control sequence is equal to a second predetermined length, different from the first predetermined length.

42. The method of claim 39 wherein determining a position of a next one of the sequential control sequences from the first one of the number of sequential control sequences, comprises:
   determining a length of the first one of the number of sequential control sequences; and
   setting the position of the next one of the sequential control sequences equal to a value of a first number of bits of the first one of the number of sequential control sequences if the length of the first sequential control sequence is equal to a first predetermined length, and setting the position of the next one of the sequential control sequences equal to a value of a second number of bits of the first one of the number of sequential control sequences if the length of the first sequential control sequence is equal to a second predetermined length, different from the first predetermined length.

43. The method of claim 39, further comprising:
   first determining that a message is in a compressed form.

44. The method of claim 39, further comprising:
   checking a flag in the first control sequence to determine a type of compression applied to the message.

45. The method of claim 39, further comprising:
   determining that there is no next sequential control sequences if the sequential control sequence is equal to a null value.

46. The method of claim 39 wherein the additional sequential control sequences only identify the position of the respective next occurrence of the first repetitive sequence, if any.

47. A computer-readable medium whose contents cause a computer system to automatically decompress a GIOP message by:
   determining from a first control sequence in a message, a position of a first one of a number of sequential control sequences in the message;
   determining from the first one of the number of sequential control sequences, a length of a first repetitive sequence of sequential values in the message and a position of a next one of the number of sequential control sequences;
   determining each of the values of the first repetitive sequence of sequential values based on the determined length of the first repetitive sequence of sequential values;
   for each of the other sequential control sequences in the message, determining from the sequential control sequence a position of a next one of the number of sequential control sequences, if any;
   removing the first control sequence from the message;
   removing the first sequential control sequence from the message; and for each occurrence of the other sequential control sequences, replacing the sequential control sequence with each of the determined values of the first repetitive sequence of sequential values.

48. A system for automatically compressing GIOP messages, comprising:

determining from a first control sequence in a message, a position of a first one of a number of sequential control sequences in the message;

a subsystem that determines from the first one of the number of sequential control sequences, a length of a first repetitive sequence of sequential values in the message and a position of a next one of the number of sequential control sequences;

a subsystem that determines each of the values of the first repetitive sequence of sequential values based on the determined length of the first repetitive sequence of sequential values;

a subsystem that, for each of the other sequential control sequences in the message, determines from the sequential control sequence a position of a next one of the number of sequential control sequences, if any;

a subsystem that removes the first control sequence from the message;

a subsystem that removes the first sequential control sequence from the message; and a subsystem that, for each occurrence of the other sequential control sequences, replaces the sequential control sequence with each of the determined values of the first repetitive sequence of sequential values.

* * * * *